(12) United States Patent
Chiueh et al.

(10) Patent No.: US 7,170,800 B2
(45) Date of Patent: Jan. 30, 2007

(54) LOW-POWER DELAY BUFFER CIRCUIT

(75) Inventors: Tzi-Dar Chiueh, Taipei (TW);
Po-Chun Hsieh, Kaohsiung (TW)

(73) Assignee: National Taiwan University, Taipei (TW)

( * ) Notice: Subject to any disclaimer, the term of this patent is extended or adjusted under 35 U.S.C. 154(b) by 108 days.

(21) Appl. No.: 11/124,999

(22) Filed: May 9, 2005

(65) Prior Publication Data
US 2006/0152980 A1    Jul. 13, 2006

(30) Foreign Application Priority Data
Dec. 31, 2004    (TW) .............................. 93141758 A

(51) Int. Cl.
*G11C 7/00*    (2006.01)
(52) U.S. Cl. .................. 365/194; 365/233; 365/189.12

(58) Field of Classification Search ................ 365/194, 365/233, 189.12, 193, 230.01, 189.11
See application file for complete search history.

(56) References Cited

U.S. PATENT DOCUMENTS

2002/0000855 A1*    1/2002    Lee ............................ 327/158

* cited by examiner

*Primary Examiner*—Anh Phung
*Assistant Examiner*—Dang Nguyen

(57) ABSTRACT

A low-power delay buffer circuit is provided, which utilizes a ring counter as address decoder and a latch array for memory. To reduce power consumption, a gated-clock driver tree is applied to the ring-counter addressing architecture. Moreover, a similar gated-driver tree is applied to the input and output ports of the latch array. The delay buffer circuit not only could achieve a power consumption lower than SRAM-based delay buffers, but also could operation under high frequencies and take up less layout area than SRAM-based delay buffers.

24 Claims, 13 Drawing Sheets

LOW-POWER DELAY BUFFER CIRCUIT

BACKGROUND OF THE INVENTION

1. Field of the Invention

The present invention generally relates to delay buffers, and more particularly to a delay buffer circuit using gated driver tree architecture.

2. The Prior Arts

In recent years, as wireless networks are gaining widespread popularity, numerous communications standards are established and adopted, mobile communications devices such as handsets, personal digital assistants (PDA), etc., have become the mainstream product of consumer electronics market. Most of the mobile communications devices are powered by a battery and, as these devices are getting increasingly complicated and functional-rich, how to let batteries of a limited capacity to sustain these devices for the longest operation time concerns all product vendors. One of the approaches is of course to reduce the power consumption of these devices' relevant circuits.

In a digital processing chip of mobile communications, the delay buffer takes up a large portion of the circuit layout. If the power consumption of the delay buffer could be reduced significantly, the overall power consumption of the digital processing chip could be reduced significantly as well. On the other hand, as these chips are working at even higher operation frequencies, a new, low-power delay buffer should be operable under high frequencies. FIG. 1 is a schematic diagram showing a conventional delay buffer having a length N and a data width W bits using shift registers. As illustrated, the delay buffer contains N×W shift registers 10, arranged between the input and the output in N stages, each with W shift registers. The N×W shift registers are triggered by a same clock signal CLK. For every clock period of CLK, W-bit data is shifted from W shift registers of a previous stage to those of a next stage, and so on. A W-bit data input N clock periods ago therefore would be delayed and output after N clock periods. The clock signal CLK is provided to all N×W shift registers, contributing to the high power consumption. Moreover, the N×W shift registers would also take up a large die area. Therefore, in real life, delay buffer such as the one in FIG. 1 is seldom used.

One of the common delay buffer implementation is a dual-port SRAM memory whose operation is different from that of the shift-register-based delay buffer. For an N×W SRAM-based delay buffer, there is no data movement between stages. Instead, at every clock period, a W-bit data is written to one of the N×W storage locations of the SRAM-based delay buffer, and another W-bit data that is written N clock periods ago is output. The power consumption of a SRAM-based delay buffer is mainly from the address decoder and the drivers for its input and output ports. As memory related technology has already quite mature and satisfactory results in terms of layout area and speed are achievable. Therefore in reality a delay buffer is often implemented using SRAM memory.

SUMMARY OF THE INVENTION

The major objective of the present invention is to provide a low-power delay buffer circuit, which not only could achieve a power consumption even lower than that of SRAM-based delay buffers but also could operation under high frequencies and take up less layout area than SRAM-based delay buffers.

The delay buffer circuit of the present invention, as illustrated in FIG. 2, utilizes a ring counter as an address decoder similar to that of a SRAM memory. In addition, a latch array or similar memory is used for the storage of data. To reduce power consumption, a gated-clock driver tree is applied to the ring counter so as to reduce significantly the power consumption of the ring counter. Moreover, a similar gated driver tree is applied to the input and output ports of the latch array so as to reduce significantly the power consumption of the latch array.

The following table compares the layout areas, power consumptions under 200 MHz and 50 MHz between the present invention and dual-port SRAM memory for 32×8, 64×8, 128×8, 245×8, and 512×8 delay buffers:

|  | Present invention | Dual-port SRAM |
| --- | --- | --- |
| Length = 32, Width = 8 bits | | |
| Layout area (um²) | 10218 | 49941 |
| Power consumption under 200 MHz (uW) | 410 | 24592 |
| Power consumption under 50 MHz (uW) | 102 | 6148 |
| Length = 64, Width = 8 bits | | |
| Layout area (um²) | 27336 | 58752 |
| Power consumption under 200 MHz (uW) | 654 | 25244 |
| Power consumption under 50 MHz (uW) | 161 | 6310 |
| Length = 128, Width = 8 bits | | |
| Layout area (um²) | 56028 | 75990 |
| Power consumption under 200 MHz (uW) | 752 | 26542 |
| Power consumption under 50 MHz (uW) | 186 | 6634 |
| Length = 256, Width = 8 bit | | |
| Layout area (um²) | 120408 | 177203 |
| Power consumption under 200 MHz (uW) | 1425 | 29502 |
| Power consumption under 50 MHz (uW) | 346 | 7286 |
| Length = 512, Width = 8 bit | | |
| Layout area (um²) | 242088 | 182793 |
| Power consumption under 200 MHz (uW) | 1710 | 30480 |
| Power consumption under 50 MHz (uW) | 415 | 7820 |

As illustrated, for delay buffers having a width of 8 bits and a length between 16 and 512, the present invention consumes much less power than SRAM memory. For shorter delay buffers which have a length between 32 and 64, the present invention consumes 1/30 to 1/60 of the power consumed by SRAM memory. For longer delay buffers, even though the power saving is not as great since the gated driver tree of the latch array has to be increased in order to maintain 200 MHz operation frequency, the present invention still consumes less than 1/10 of the power consumed by SRAM memory.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

In the following, detailed description along with the accompanied drawings is given to better explain preferred embodiments of the present invention.

Figure 1:
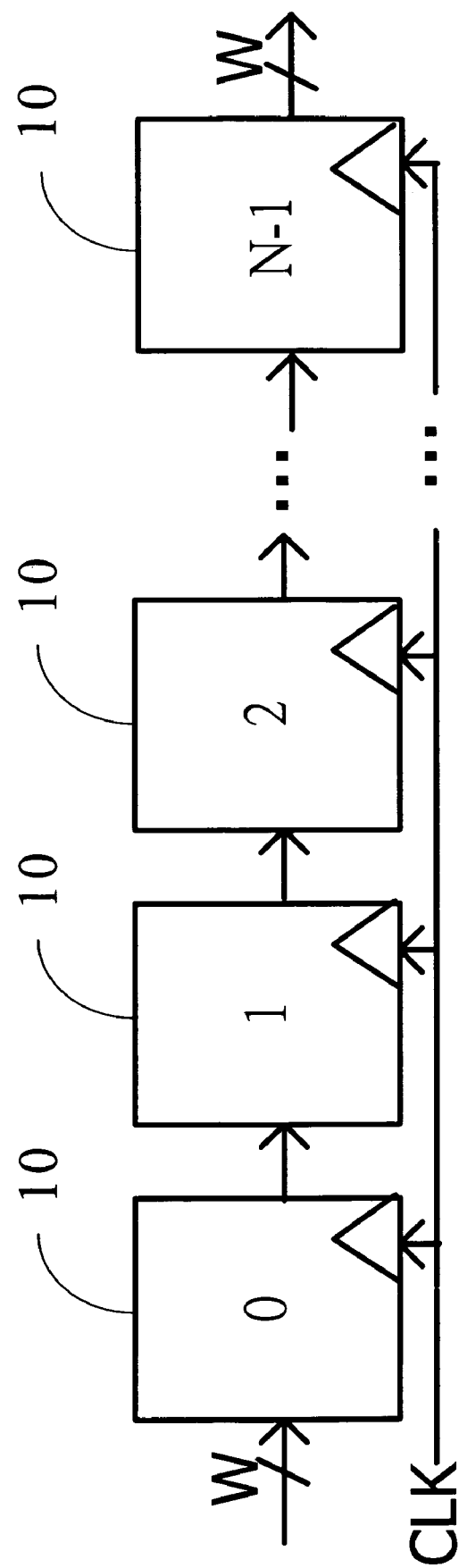
FIG. 1 is a schematic diagram showing a conventional delay buffer having a length N and a data width W bits using shift registers.
Figure 2:
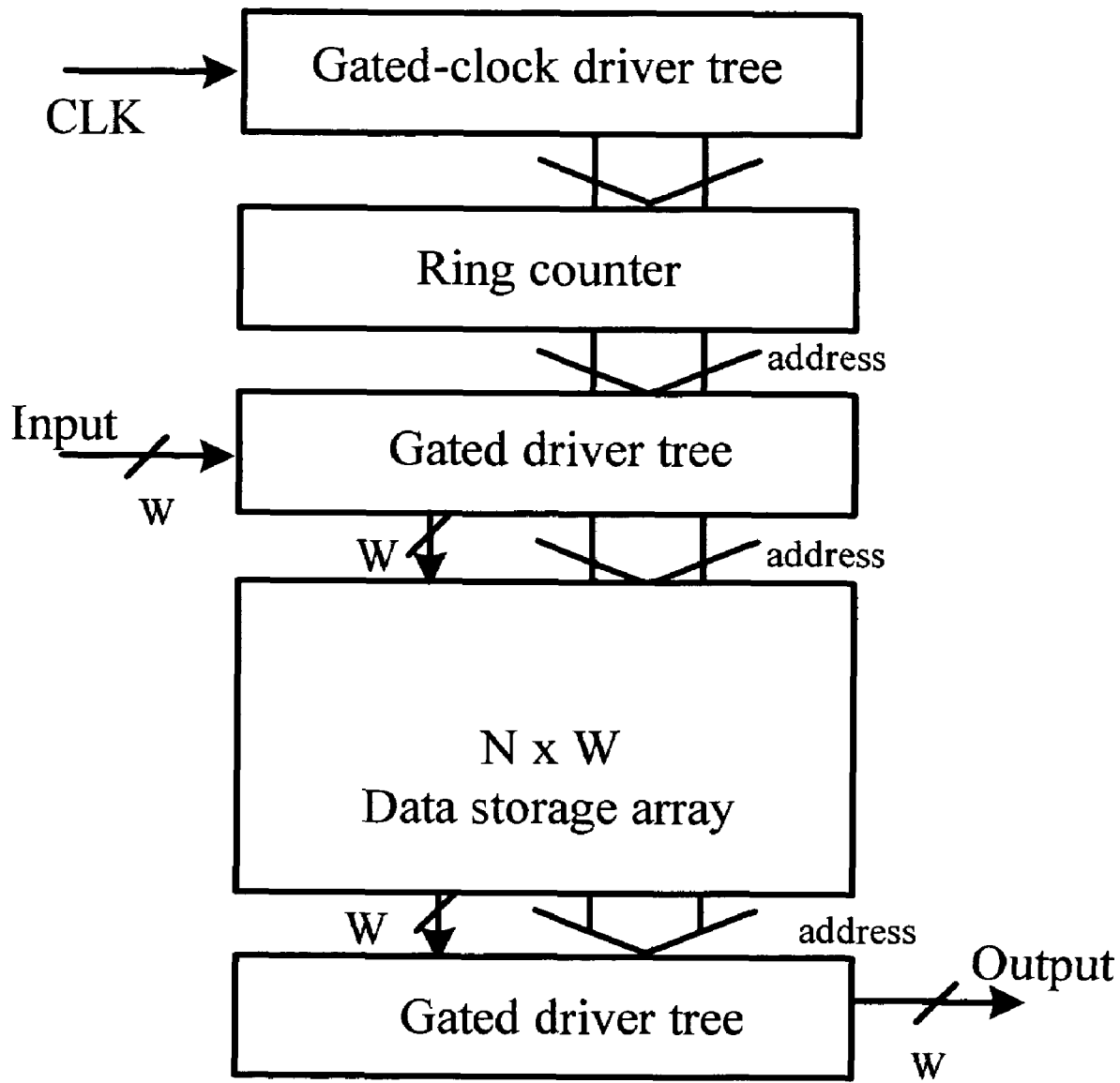
FIG. 2 is a schematic diagram showing a delay buffer circuit according composed of the present invention.
Figure 3:
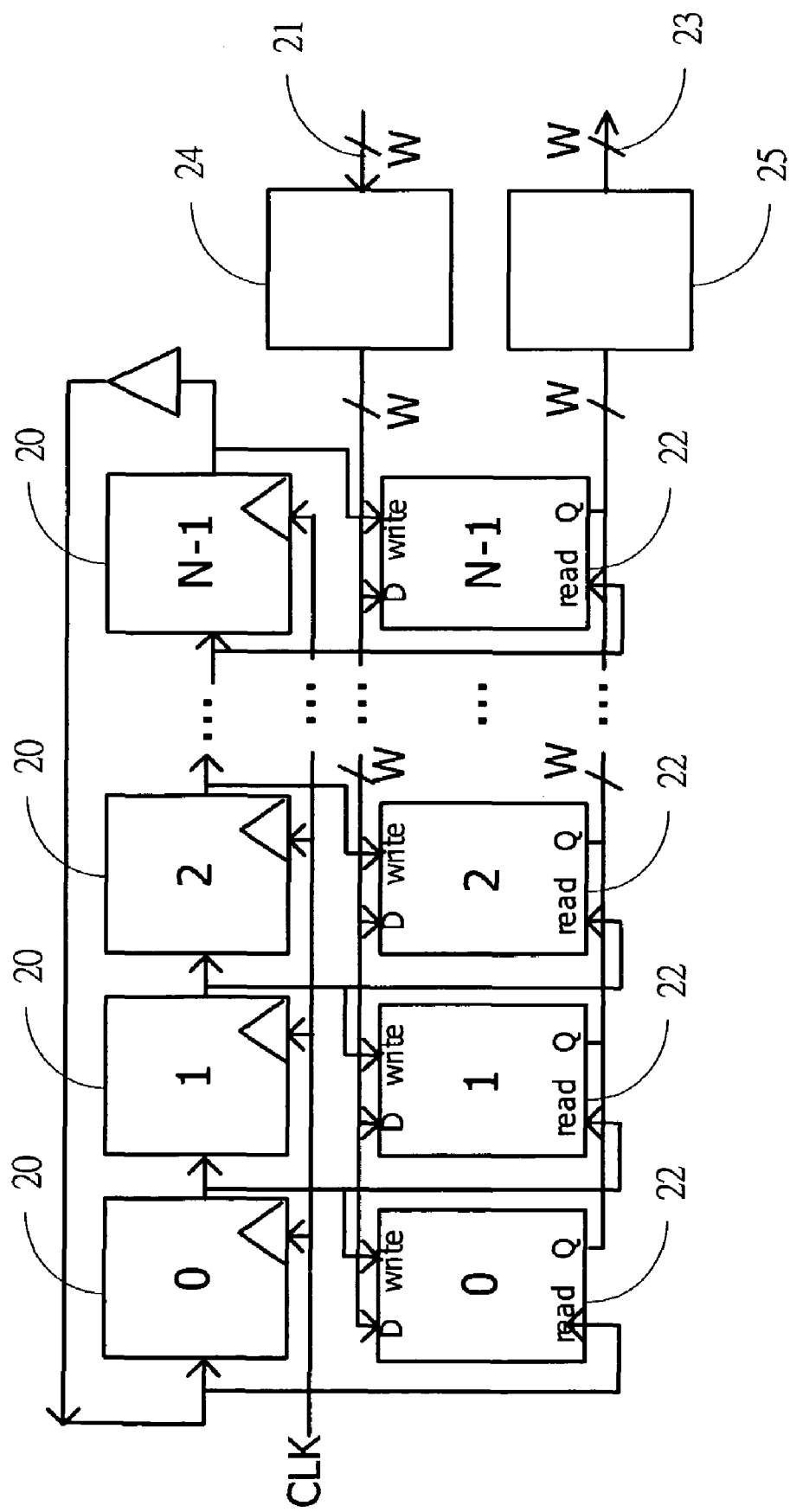
FIG. 3 is a schematic diagram showing a N×W delay buffer circuit composed of a ring counter and a latch array.

The delay buffer circuit of the present invention utilizes a ring counter as an address decoder similar to that of a SRAM memory. In addition, a latch array or similar memory is used for the storage of data. FIG. 3 is a schematic diagram showing an N×W delay buffer circuit composed of a ring counter and a latch array. As illustrated, the latch array is composed of N groups of latches 22 and each group of latches 22 contains W latches (not shown in FIG. 2), jointly for the storage a W-bit data. The input port D and output port Q of the N groups of latches 22 are connected to the input bus 21 and output bus 23, which in turn connect to two registers 24 and 25 respectively. The ring counter is composed of N series-connected shift registers 20, with the output of the last shift register 20 (numbered N−1) looped back to the input of the first shift register 20 (numbered 0). In addition, every shift register 20 supplies its output simultaneously to the write enable inputs of a group of latches 22 at the same stage as the shift register, and to the read enable inputs of another group of latches 22 at the next stage. The clock signal is supplied simultaneously to the N shift registers 20 of the ring counter.

At any point in time, there must be a "1" at one of the outputs of the N shift registers 20. Assuming it is the shift register K, this "1" controls the two neighboring groups K and K+1 of latches. For the group K of latches, the "1" causes a W-bit input data is written into the group K of latches while, for the group K+1 of latches, the "1" causes another W-bit data output form the group K+1 of latches. Since the "1" of the ring counter is passed stage by stage in sequence, for the same group of latches, they will first output their stored data and, at the next clock period, they will be written into with a new data. After the new data is written, the ring counter will output the data after a cycle of N−1 clock periods and, therefore, a delay by N−1 clock periods is achieved.

In the foregoing delay buffer circuit, besides using common positive-edge-triggered shift registers, double-edge-triggered shift registers could be used as well to cut down the operation frequency in half so as to achieve power reduction. Regardless the type of the shift registers used, power consumption could be further reduced by a careful control the supply of the clock signal. The power consumption of the ring counter mainly comes from the clock signal CLK's direct driving N shift registers at the same time. Since the input D to most of the shift registers remains unchanged ("0"), the operation of the delay buffer will not be affected even if no clock signal is provided to these shift registers whose input values are not changed.

Figure 4:
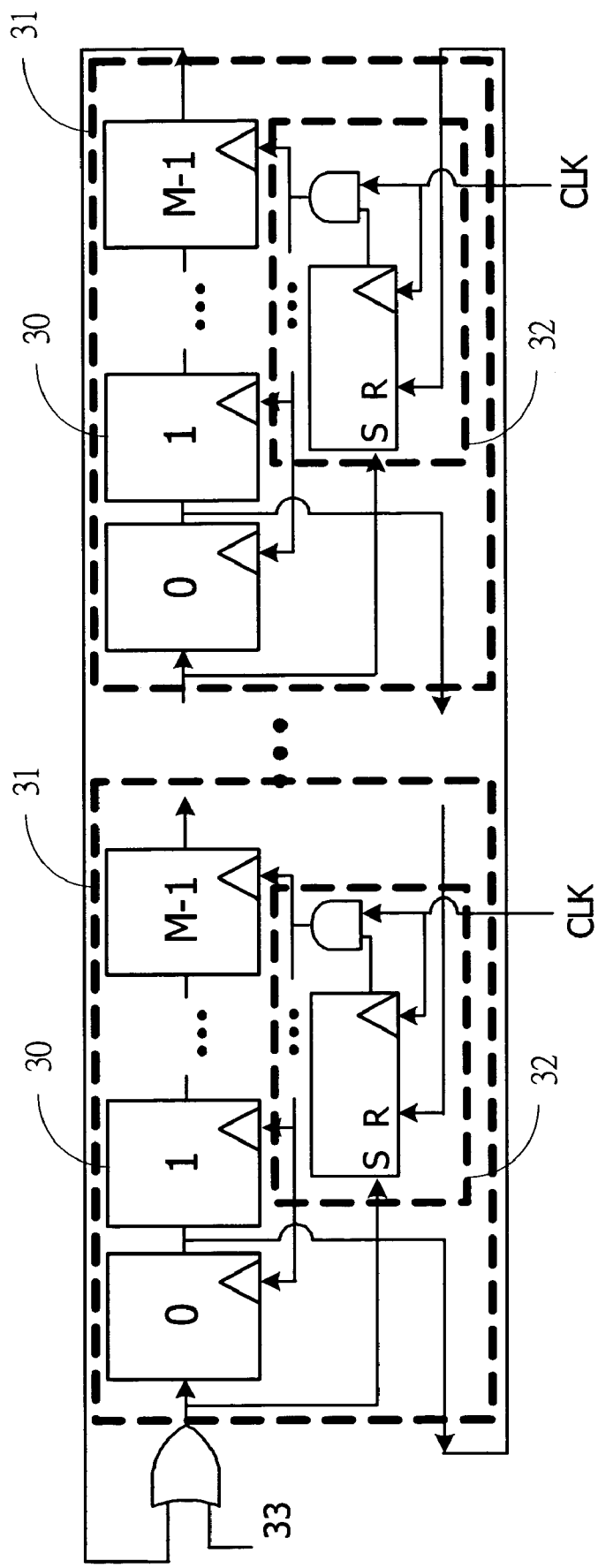
FIG. 4 is a schematic diagram showing a delay buffer circuit with a single-level gated-clock driver tree according to an embodiment of the present invention.

The present invention therefore adopts a gated-clock driver tree so that these shift registers will not become an unnecessary burden to the clock signal. In its simplest form, the gated-clock driver tree has a single level as shown in FIG. 4. In FIG. 4, the length of the ring counter is N and the N shift registers 30 are divided into N/M blocks 31, each of which contains M shift registers 30. The most significant feature of the present invention lies in that only the M shift registers 30 in a block is triggered by the clock signal CLK, instead of all N shift registers 30. As such, the load of the clock signal CLK is the M shift registers 30 plus the block control circuits 32 of the N/M blocks. The block control circuit 32 could be implemented differently in different embodiments. In the embodiment shown in FIG. 4, the block control circuit 32 is made of an AND gates (not numbered) and an RS Flip-Flop (not numbered).

The working principle of the present embodiment is as follows. Within a cycle of the ring counter, when the input to the first shift register 30 of a block 31 is changed from "0" to "1" for the first time, this means that the "1" output by the ring counter has entered the current block 31 and the M shift registers 30 therewithin should begin to receive the clock signal CLK so that the "1" could be passed along sequentially. Therefore, the input to the first shift register 30 of the block 31 is connected to the S terminal of the RS Flip-Flop of the block. Before the next clock arrives, the control signal output by the RS Flip-Flop to the AND gate would have become "1," causing the current block to begin receiving the clock signal CLK. The R terminal of the RS Flip-Flop is connected to the output of the first shift register in the next block. This is because, when the output of the last shift register in the current block returns to "0", the current block no longer requires the clock signal as the "1" is leaving the current block. The "1" in propagation is exactly at the output of the first shift register in the next block. Therefore, by feeding backing the output of the first shift register in the next block to the R terminal of the RS Flip-Flop, the control signal to the AND gate would become "0" and stop the supply of the clock signal to the shift registers in the current block.

Figure 5:
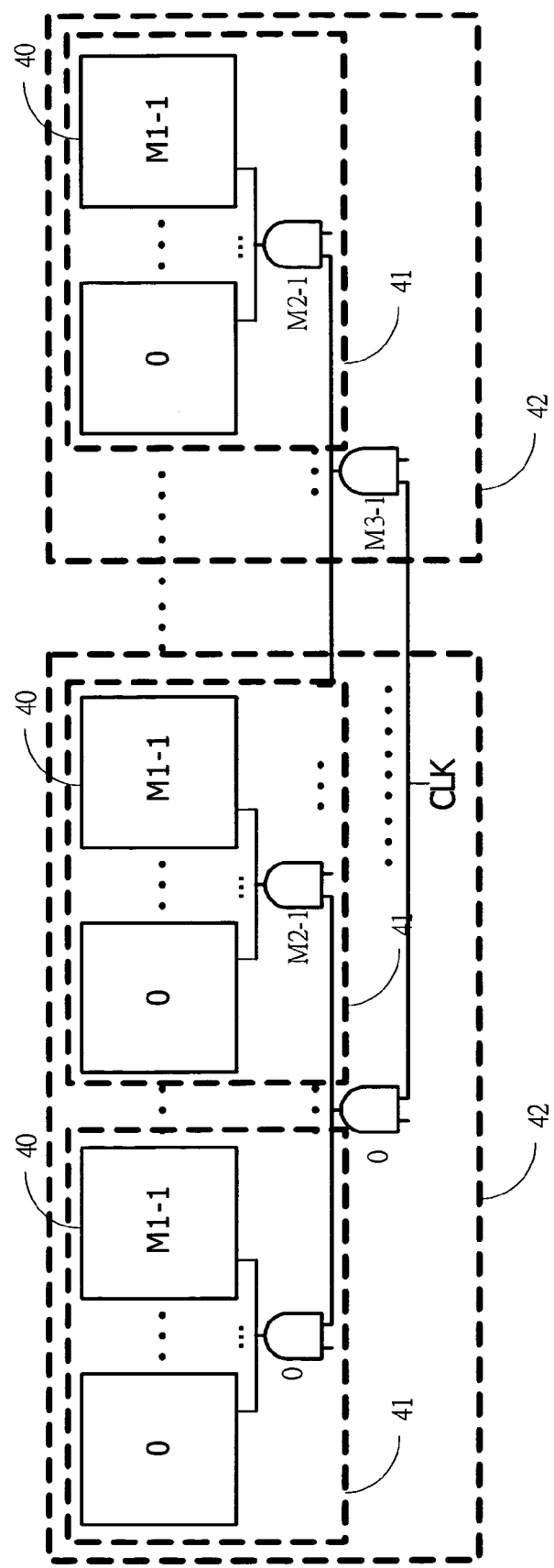
FIG. 5 is a schematic diagram showing a delay buffer circuit with gated-clock driver tree according to the present invention.

The foregoing circuit, even though reducing the load of the clock signal CLK from N shift registers to M, has an additional load of N/M AND gates and RS Flip-Flops. However, by a multi-level gated-clock driver tree, the load of the block control circuits to the clock signal could be further reduced. The concept is illustrated in FIG. 5. As illustrated, the ring counter has a length N=M×M1×M2×M3. If every M shift registers are grouped together, there will be M1×M2×M3 level 0 blocks 40. For these M1×M2×M3 level 0 blocks 40, if every M1 blocks 40 are grouped together, there will be M2×M3 level 1 blocks 41. Every level 1 block 41 contains M1 level 0 blocks 40 and has in total M×M1 shift registers (not shown). If the "1" of the ring counter is about to enter or is already in a level 1 block 41, only the shift registers in the current level 1 block 41 requires the clock signal CLK. For those level 1 blocks 41 that are idle, there is no need to supply the clock signal CLK so as to reduce the load. Following the foregoing concept, if every M2 level 1 blocks 41 are grouped together, there will be M3 level 2 blocks 42. As such, the load of the clock signal CLK of FIG. 4:

M×Load(shift register)+M1×M2×M3×Load(block control circuit) is reduced to a much smaller load of FIG. 5:

M×Load(shift register)+(M1+M2+M3)×Load(block control circuit), where Load(shift register) and Load(block control circuit) stand for the loads of a shift register and a block control circuit to the clock signal respectively.

As shown in FIG. 5, each of the blocks at every level of the gated-clock driver tree has a corresponding AND gate (not numbered) and every AND gate requires a control signal to decide whether to provide the clock signal to the blocks that it drives. The gated-clock driver tree depicted in FIG. 5 has its control signals generated in a hierarchical manner and, therefore, it is not suitable for high-frequency applications. In the following, the present invention adopts a block control approach so that the control signals to the AND gates are generated from the outputs of the ring counter, instead of being propagated level by level. For simplicity sake, only the control signals for the level 0 and level 1 AND gates are explained as follows. The principle could be applied to higher level AND gates as well and therefore their explanation is omitted here.

For the embodiment shown in FIG. 4, the block control circuit 32 for a block 31 is composed of an RS Flip-Flop and an AND gate, which both are loads to the clock signal CLK. There are various other ways to implement the block control circuit. In the following, a C-element is used to replace the RS Flip-Flop for the supply of the AND gate's control signal, and the C-element does not require the trigger of the clock signal so as to further reduce the power consumption as:

M×Load(shift register)+(M1+M2+M3)×Load(AND gate)

Figure 6:
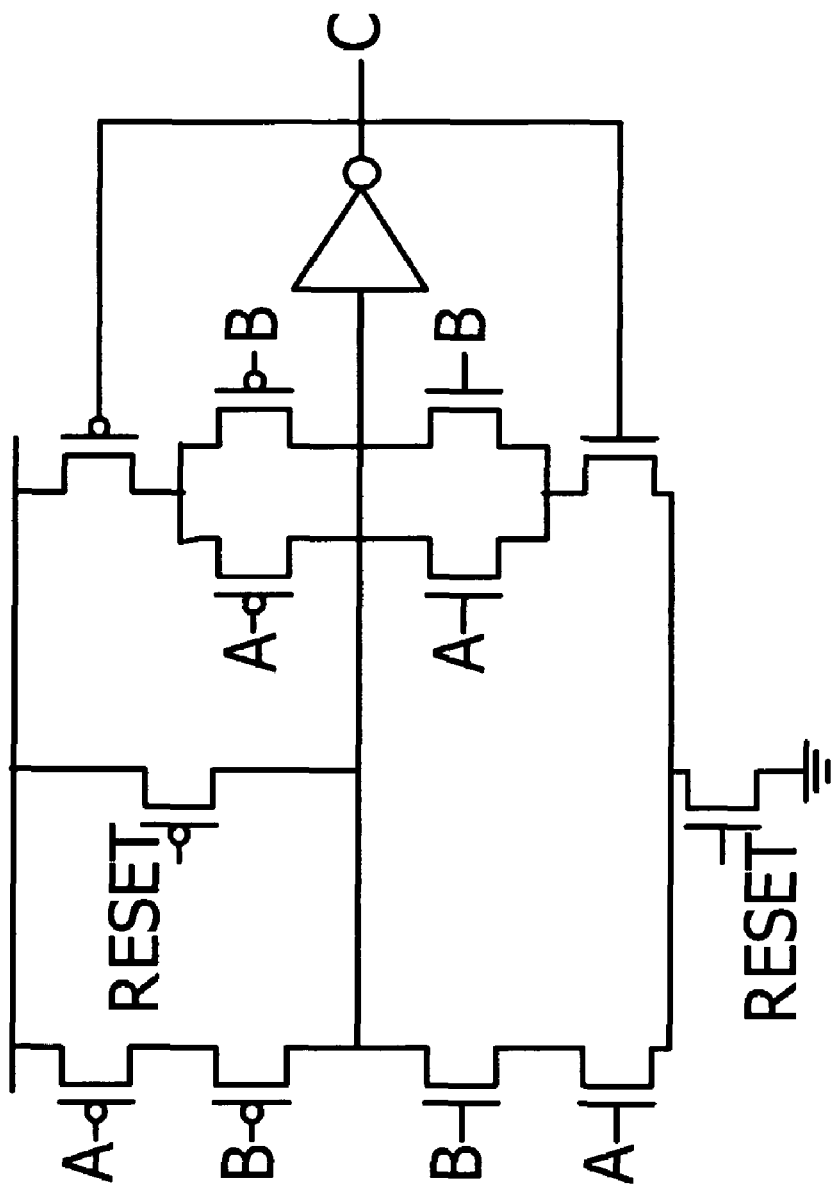
FIG. 6 is a schematic diagram showing a static, dual-input C-element.

FIG. 6 is a schematic diagram showing a static, dual-input C-element. C-elements are commonly used for control logics in asynchronous circuits, as the C-elements do not generate glitches and the control signals provided by the C-elements are reliable. The function of a C-element is as follows:

$$\begin{cases} C = A = B, & \text{if } A = B \\ C = C_{pre}, & \text{else} \end{cases},$$

or it could be expressed as:

$C = AB + AC_{pre} + BC_{pre}$, where A, B are the inputs and C is the output to the dual-input C-element, and $C_{pre}$ stands for the previous state of the output. Therefore, in applications, the C-element will not change its output unless all inputs have changed states.

Figure 7A:
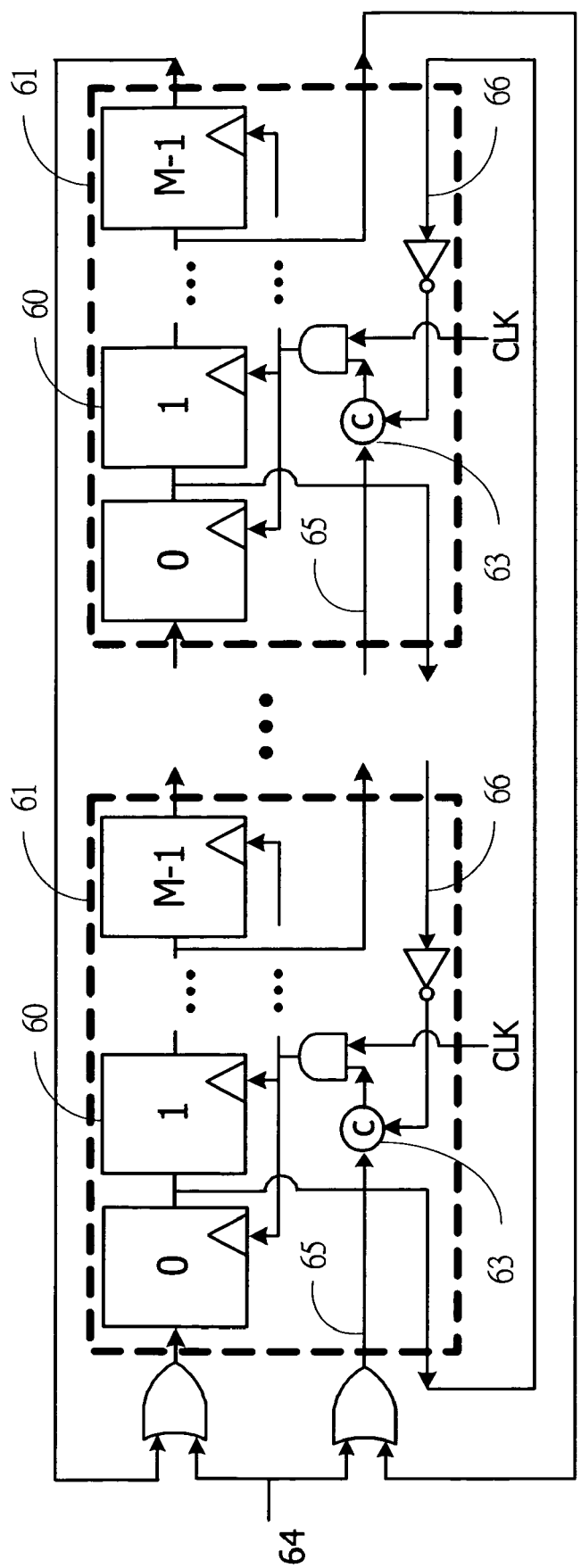
FIG. 7a is a schematic diagram showing the level 0 of a ring counter with a gate-clock driver tree according to an embodiment of the present invention.
Figure 7B:
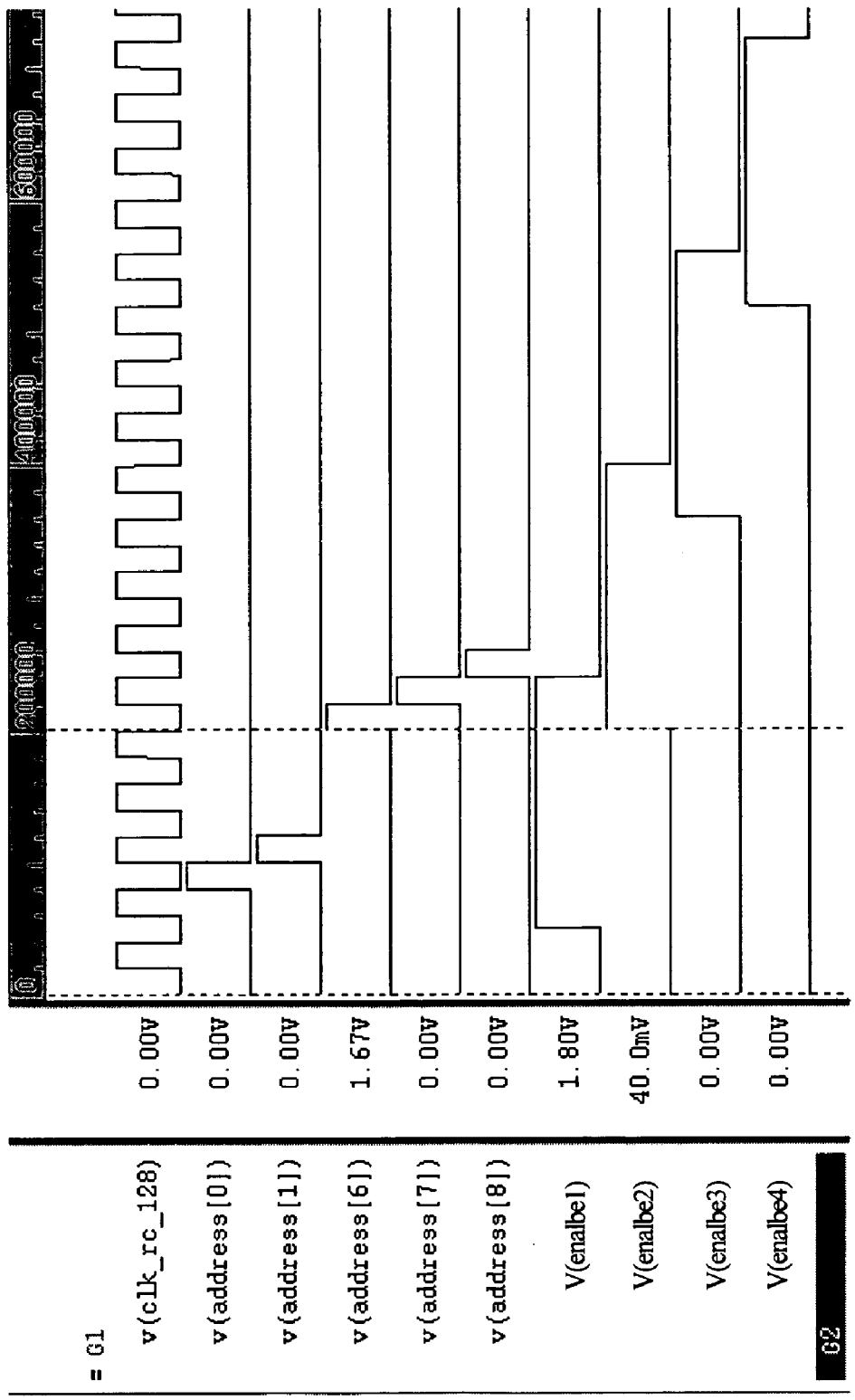
FIG. 7b is a timing sequence diagram of a delay buffer circuit with a gated-clock driver tree according to an embodiment of the present invention.
Figure 8:
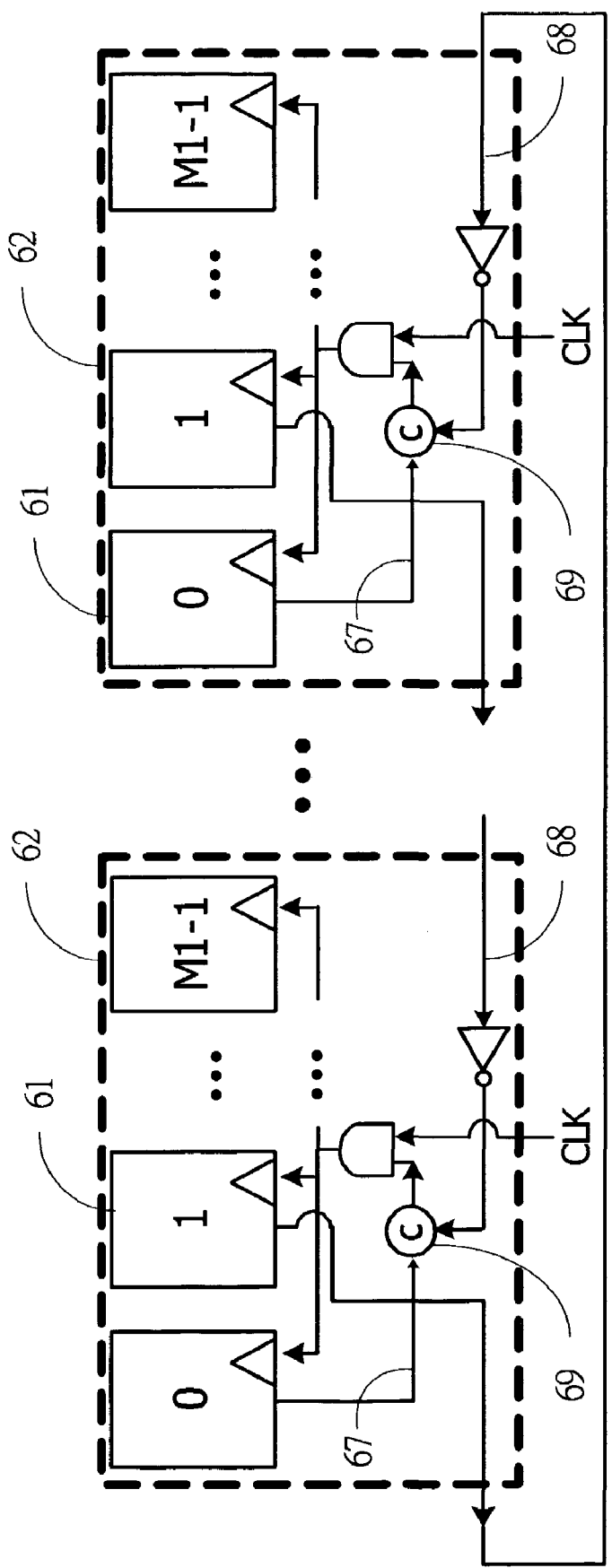
FIG. 8 is a schematic diagram showing the level 1 of a ring counter with a gate-clock driver tree according to an embodiment of the present invention.

FIG. 7a is a schematic diagram showing the level 0 of a ring counter with a gate-clock driver tree according to an embodiment of the present invention. As illustrated, block 61 requires two additional OR gates to provide the first "1" for the initialization signal 64 of the ring counter. Whether the clock signal CLK is supplied to the block 61 is controlled by the control signal output from the C-element 63 to the AND gate (not numbered). The "start" control signal 65 to the C-element 63 which causes the clock signal to be supplied to the current block 61 is taken from the output of the second to the last shift register 60 of the previous block 61. The "stop" control signal 66 to the C-element 63 which stops the clock signal to be supplied to the current block 61 is taken from the output of the first shift register 60 of the next block 61. For a block which contains M shift registers, there are M+2 clock periods from "start" to "stop," since the "start" signal is taken from the output of the second shift register 60 from the end of the previous block 61, and, in the last clock period within the current block, the last shift register 60 has to access the input "0" again to ensure there is only one "1" among the outputs of the ring counter. FIG. 7b is a timing sequence diagram of the delay buffer shown in FIG. 7a. Assuming that there are 8 shift registers in the lowest level blocks, address[0]~address[7] are the output of the first block, address[8] is the output of the second block, V(enable1) and V(enable2) are the output of the AND gates of the first and second blocks respectively. It can be seen that the "start" signal of the second block begins when address [6] is on its rising edge while the "stop" signal of the first block ends when address[8] is on its rising edge. By applying the foregoing principle to the higher level of the gated-clock driver tree, the hierarchical driving of the AND gates could be avoided. FIG. 8 is a schematic diagram showing the level 1 of a ring counter with a gate-clock driver tree according to an embodiment of the present invention. Comparing FIGS. 7a and 8, it could be seen that the "start" and "stop" signals are applied repeatedly. A "start" signal 67 for a level 1 block 62 is also the "start" signal 65 for the first level 0 block 61 under the level 1 block 62. Similarly, a "stop" signal 68 for a level 1 block 62 is also the "stop" signal 66 for the last level 0 block 61 under the level 1 block 62. Both the "start" and "stop" signals 66 and 68 control an AND gate via a C-element 69.

When data is input to the latch array and output from the latch array via buses, an input data is provided to every group of latches connected to the bus and the output of the latch array is a common output directly from every group of latches. As there are N groups of latches, both the input and output ports of the latch array suffer significant loads and, thereby, consume a great amount of power. The read/write control to the latch array is from the address signals generated by the ring counter and, at any point in time, there is only a "1" among the address signals. It is mentioned earlier that the address signal "1" controls two neighboring groups of latches simultaneously, causing one to read out its data and a new data to be written into the other. Besides these two reading and writing groups of latches, the other groups of latches, even without the provision of read/write control, wouldn't affect the function of the delay buffer. Therefore, similar gated driver tree architecture as in the aforementioned gated clock driver tree could be adopted for the latch input and output ports to further reduce power consumption.

Figure 9:
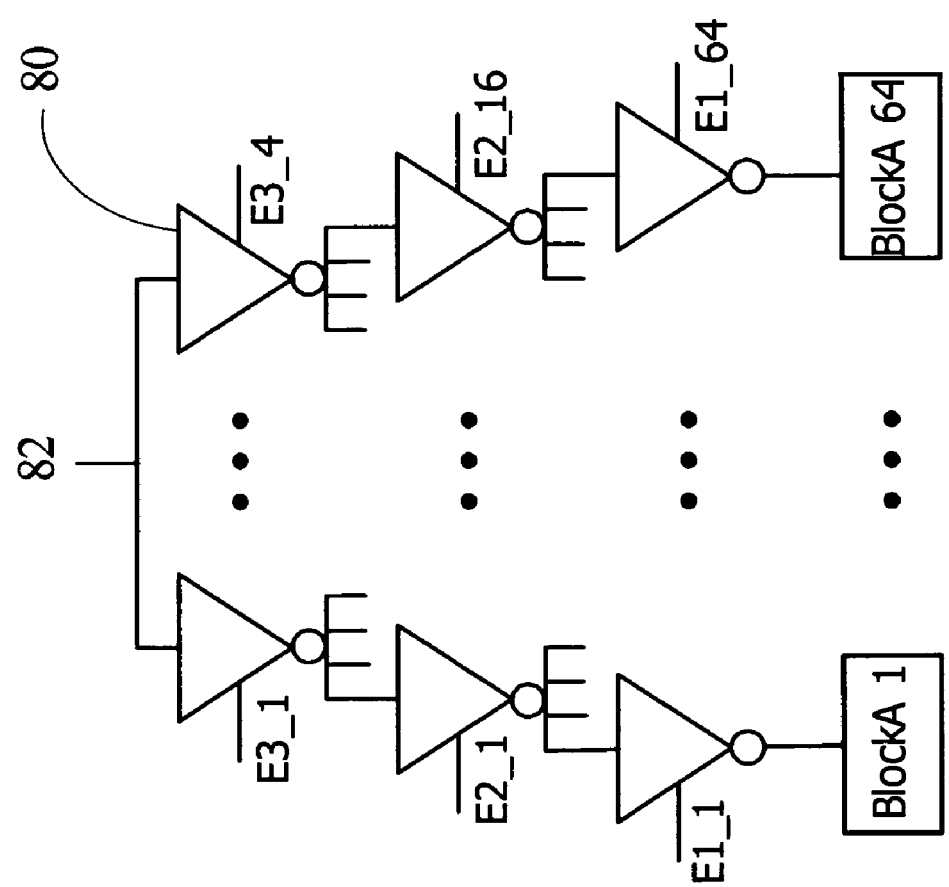
FIG. 9 is a schematic diagram showing a de-multiplexer at the input port of a latch array according to the present invention.

In the following, the application of the gated driver tree at the input port of the latch array is explained first. The gated driver tree at the input port of the latch array uses tri-state inverters for block control logics, instead of using the AND gates as in the gated-clock driver tree of the ring counter. Tri-state inverters couldn't be used for the ring counter, as the inverters' output is at a floating state when they are turned off and thus couldn't be used for driving the clock signal. As illustrated in FIG. 9, the use of the tri-state inverters and the gated driver tree jointly make a de-multiplexer driver architecture for the input port of the latch array.

The latches for every M addresses are considered to be within a block. When the address signal "1" indicates an address within a block, the ring counter would turn on all the tri-state inverters on a path to the block and a data is written to that address via the path. As shown in FIG. 9, the control signal $Ei\_j$ is for the tri-state inverter 8 at level i and position j. Assuming that there are M latches in a block and $M1=M2=\ldots=4$, if the address signal "1" is at a block between the block $1+(j-1)\times 4^{(i-1)}$ and the block $j\times 4^{(i-1)}$, all the control signals $Ei\_j$ would become 'For example, in order to write into a latch in the block BlockA 1, all the control signals $E1\_1$, $E2\_1$, $E3\_1$ would be "1" and $E1\_1$ would cause the M latches in the block BlockA 1 to be write-enabled so that the input data 82 could be written into the right latch.

As such, when a data is to be written into a location of the latch array, the load is no longer the latches at all locations, but'the tri-state inverters on the path and the M latches in the targeted block. Assuming that, for an N×W latch array, W=1 and M latches are in a block, originally the load to the input bus is:

Load(latch)×N

With the de-multiplexer architecture is used at the input port, the load becomes (assuming $M1=M2=\ldots=M$):

Load(latch)×M+Load(tri-state inverter)×($Log_M N-1$)×M where Load(latch) and Load(tri-state inverter) stand for the loads of a latch and a tri-state inverter to the input data respectively. If Load(latch) and Load(tri-state inverter) are considered to be equal, the load to the de-multiplexer becomes:

Load(latch)×M×$Log_M N$

If N=1024 and M=4, the number of Load(latch) drops from 1024 to 4×5=20, which is a significant saving.

Figure 10:
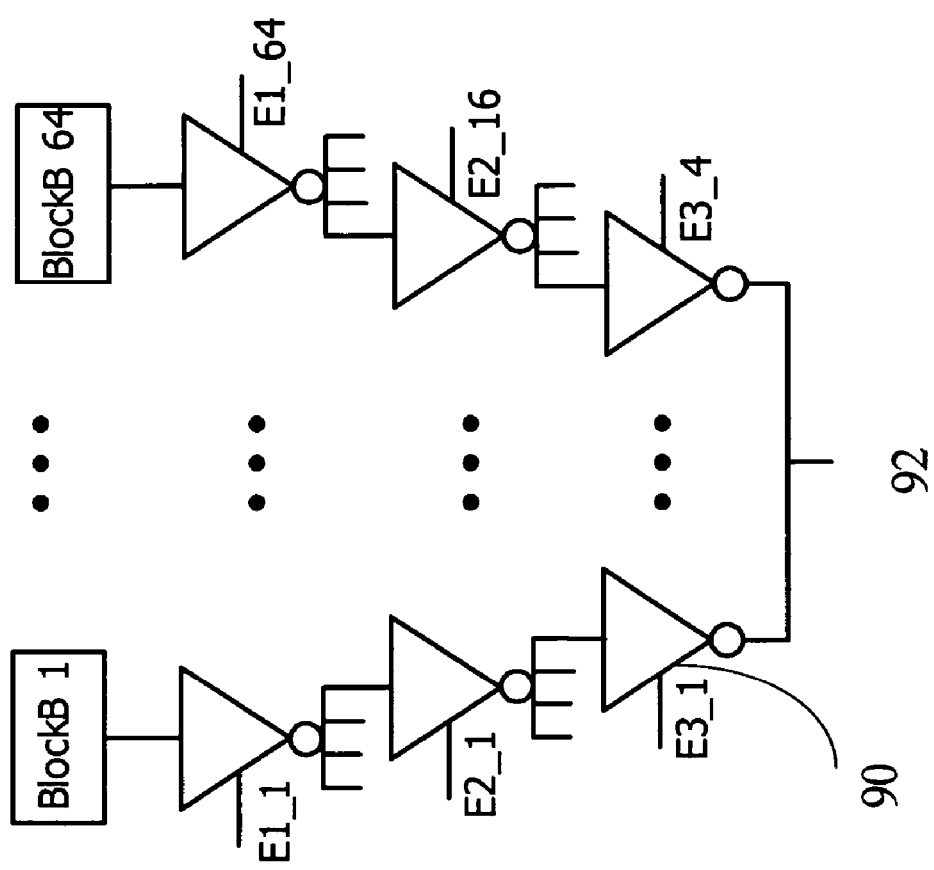
FIG. 10 is a schematic diagram showing a multiplexer at the output port of a latch array according to the present invention.

A multiplexer architecture using a similar gated driver tree could also be applied to the output port of the latch array, as illustrated in FIG. 10. As the operation principle is very much similar to FIG. 9, the description is not repeated here. According to FIG. 3, the address signal "1" of the ring counter controls two neighboring groups of latches, causing one to read out its data and a new data to be written into the other. The groups of latches are partitioned into blocks differently for input and output driver architectures and the blocks differ in only one group of latches. For example, for the input de-multiplexer architecture, the four groups of latches (from group 1 to group 4) are considered to be in a block and, for the output multiplexer architecture, another four groups of latches (from group 2 to group 5) are considered to be in a block. In this way, the tri-state inverters of the de-multiplexer at the input port and the tri-state inverters of the multiplexer at the output port could share the same $Ei\_j$ control signals.

$Ei\_j$ is produced by the output of the ring counter and a C-element, similar to what is shown in FIG. 8 except that the "start" and "stop" signals of the C-element is taken from different places of the ring counter. For a gated-clock driver tree, a block of the ring counter has to be started before the "1" has arrived and, therefore, the "start" signal to the C-element of the block has to be taken from the previous block. On the other hand, for the de-multiplexer and multiplexer architectures of the latch array, a block of latches is enabled because the address signal output from the ring counter indicates a location belonging to the block. At any point in time, every level of the driver tree has at most an $Ei\_j$ signal equal to "1." Since every level has at most an $Ei\_j$ signal equal to "1" and the address signal "1" has to be within a block of latches under $Ei\_j$, the control signal to the C-element is taken from the output of the first shift register of the corresponding shift register block in the ring counter. When the output of the first shift register of the shift register block is "1", this means that the corresponding block of latches is now in use. On the other hand, when the output of the first shift register of the next shift register block is "1", this means that the previous block of latches is no longer in use and, therefore, could be used as the "stop" signal to the previous block of latches.

Figure 11A:
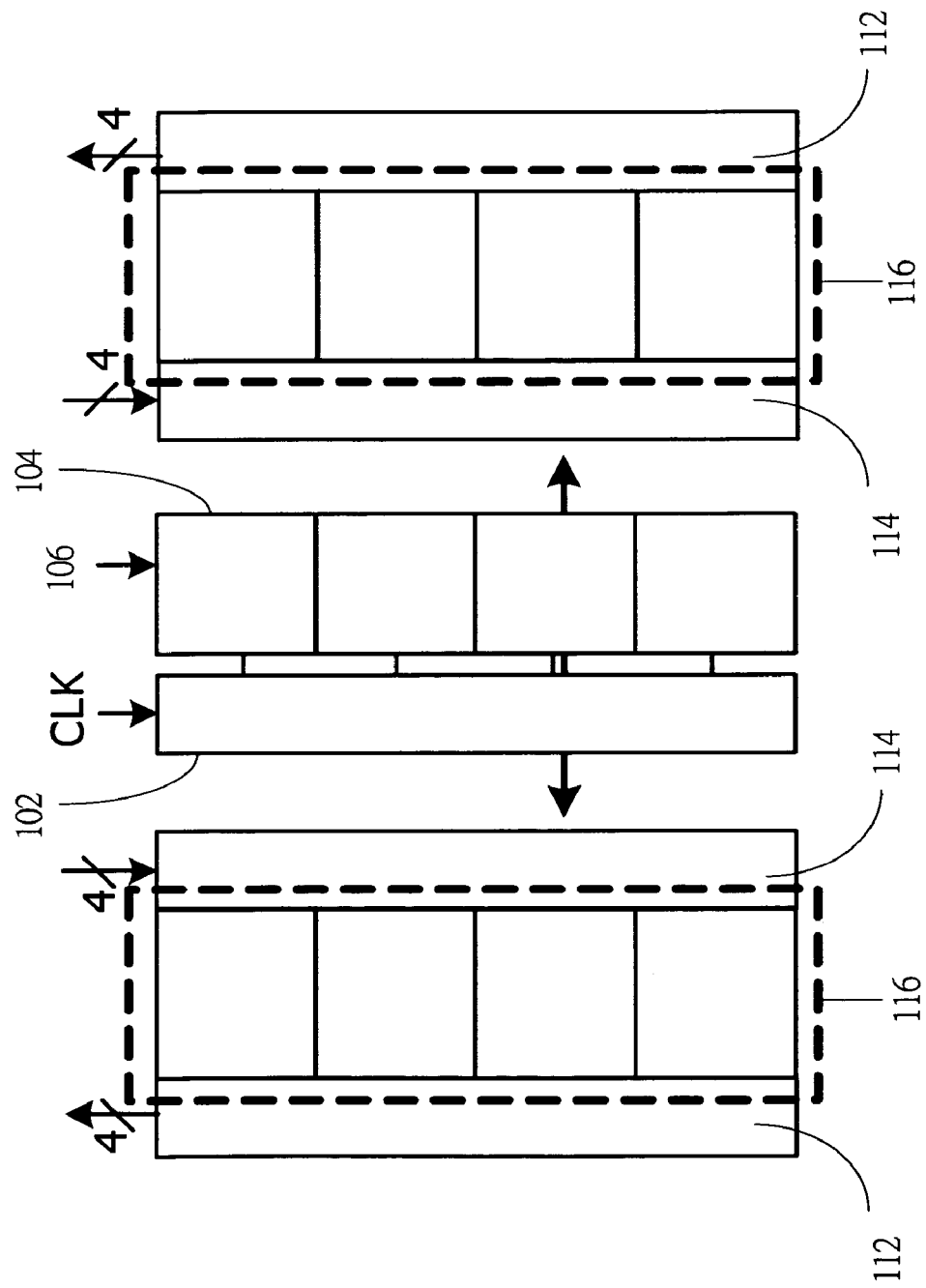
FIGS. 11a and 11b are schematic diagrams showing the wiring of 32×8 and 64×8 delay buffer circuits respectively according to the present invention.
Figure 11B:
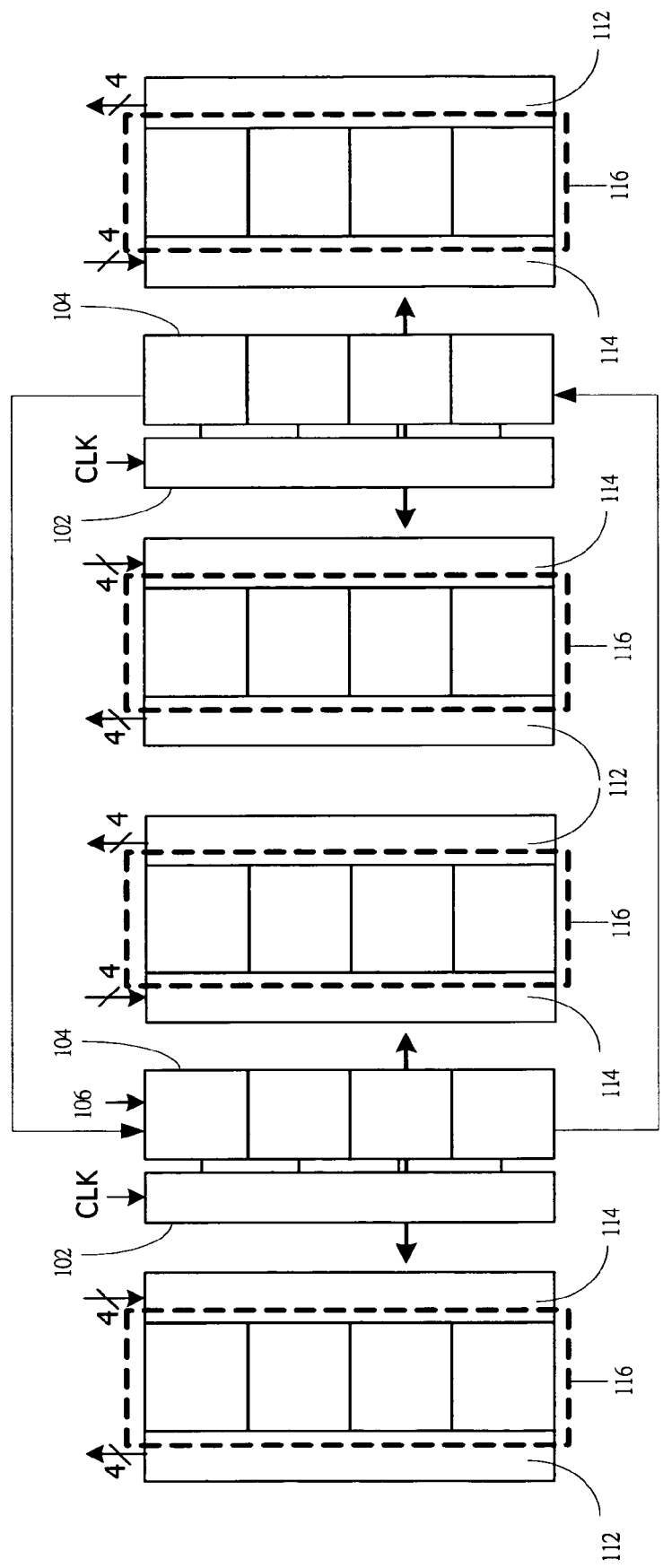

Shorter and narrower delay buffer circuits according to the present invention could be joined to form a longer and wider delay buffer. As illustrated in FIG. 11a, a gated-clock driver tree 102 controls the supply of a clock signal CLK to the shift register blocks 104, whose very first "1" is provided by the initialization signal 106. The address signals (not numbered) output from the shift register blocks 104 are delivered to the gated driver trees 114 at the input ports of two 32×4 latch arrays 116 simultaneously. The output of the latch arrays 116 is delivered through the two gated driver trees 112 at the arrays' output ports. As such, a 32×8 delay buffer is formed. If an even longer delay is required, two 32×8 modules as depicted in FIG. 11a could be joined to form a 64×8 delay buffer, as shown in FIG. 11b. Please note that the shift register blocks 104 are cascaded to form a longer ring counter but still only a single initialization signal 106 is required. If an even wider delay buffer is required, multiple delay buffers could be used in parallel under a same clock signal CLK and a same initialization signal 106. In other words, these delay buffers are working simultaneously together.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A low-power delay buffer circuit driven by an external clock signal providing a delay of length N−1 (N>1) clock cycles for a W (W≧1)-bit data, comprising:

a data storage array which has an input driver and an output driver and comprises N data storage units arranged in sequence, each of said data storage units stores a W-bit data, has an input port connected to said input driver and an output port connected to said output driver, has a read control and a write control, receives and stores an external W-bit data through said input driver when said write control is enabled, and delivers a stored W-bit data through said output driver when said read control is enabled; and a ring counter which is triggered by said external clock signal via a gated-clock driver tree and comprises N series-connected shift registers, each of said shift registers has a clock input terminal, has an input terminal connected to an output terminal of the previous shift register, or to said output terminal of the last shift register after a logic computation together with an external initialization signal if the current shift register is the first shift register, has an output terminal connected to said input terminal of the next shift register, or to said input terminal of the fist shift register after said logic computation together with said external initialization signal if the current shift register is the last shift register, and has said output terminal connected to said write control of a data storage unit at the same serial position, and to said read control of a data storage unit at the next serial position, or to said read control of the first data storage unit if the current shift register is the last shift register;

wherein said gated-clock driver tree comprises a plurality of driver units, each of which has a plurality of input terminals and an output terminal, arranged in an hierarchical architecture having K−1 (K>1) levels, the top level (level K−1) has $M_{K-1}$ driver units, each of which has one of said input terminals connected to said external clock signal simultaneously, and has said output terminal connected to one of said input terminals of one of $M_{K-2}$ driver units at the next lower level (level K−2) respectively, each of said $M_{K-2}$ driver units has said output terminal connected to one of said input terminals of one of $M_{K-3}$ driver units at the next lower level (level K−3) respectively, and so on until the bottom level (level 1) where each of $M_1$ driver units has said output terminal connected to said clock input terminals of M shift registers of said ring counter respectively, and wherein $N=M \times M_1 \times M_2 \times \ldots \times M_{K-1}$ ($M, M_1, M_2, \ldots, M_{K-1}>1$), the rest of said input terminals of every said driver unit are connected, after a logic computation, to said output terminals of a plurality of said shift registers of said ring counter respectively, said logic computation determines whether to pass said external clock signal from the upper level to the next lower level such that, at any point in time, M shift registers and $M_1 + \ldots + M_{K-1}$ driver units are activated.

2. The low-power delay buffer circuit as claimed in claim 1, wherein said data storage unit comprises at least a latch.

3. The low-power delay buffer circuit as claimed in claim 1, wherein said data storage array is a dual-port memory array having N addresses and each of said addresses stores a W-bit data.

4. The low-power delay buffer circuit as claimed in claim 1, wherein said shift register is a positive-edge-triggered shift register.

5. The low-power delay buffer circuit as claimed in claim 1, wherein said shift register is a double-edge-triggered shift register.

6. The low-power delay buffer circuit as claimed in claim 1, wherein said driver unit comprises at least an AND gate having two input terminals and an output terminal, and a control circuit having two input terminals and an output terminal, said output terminal of said AND gate is connected to said output terminal of said driver unit, said input terminals of said driver unit is connected to said input terminals of said AND gate and said control circuit, a driver unit at the top level of said hierarchical architecture has one of said input terminals of said AND gate connected to said external clock signal, a driver unit at a lower level has one of said input terminals of said AND gate connected to said output terminal of a driver unit at next higher level, the other input terminal of said AND gate connected to said output terminal of said control circuit, said control circuit has one of said input terminals connected to a start signal of the first block of M shift registers among a plurality of blocks of M shift registers under said driver unit in said hierarchical architecture, said control circuit has the other input terminal connected to a stop signal of the last block of M shift registers among a plurality of blocks of M shift registers under said driver unit in said hierarchical architecture, and said output terminal of said control circuit changes states only when both said start signal and said stop signal have changed states.

7. The low-power delay buffer circuit as claimed in claim 6, wherein said control circuit comprises a RS Flip-Flop.

8. The low-power delay buffer circuit as claimed in claim 6, wherein said control circuit comprises a C-element.

9. The low-power delay buffer circuit as claimed in claim 6, wherein said start signal of a block of M shift registers is taken from said output terminal of the second shift register from the end of the previous block of M shift registers.

10. The low-power delay buffer circuit as claimed in claim 6, wherein said stop signal of a block of M shift registers is taken from said output terminal of the first shift register of the next block of M shift registers.

11. A low-power delay buffer circuit driven by an external clock signal providing a delay of length N−1 (N>1) clock cycles for a W (W≧1)-bit data, comprising:

a data storage array which has a gated driver tree and an output driver and comprises N data storage units arranged in sequence, each of said data storage units stores a W-bit data, has an input port connected to said gated driver tree and an output port connected to an output driver respectively, has a read control and a write control, receives and stores an external W-bit data through said gated driver tree when said write control is enabled, and delivers a stored W-bit data through said output driver when said read control is enabled; and a ring counter which is triggered by said external clock signal and comprises N series-connected shift registers, each of said shift registers has a clock input terminal connected to said external clock signal, has an input terminal connected to an output terminal of the previous shift register, or to said output terminal of the last shift register after a logic computation together with an external initialization signal if the current shift register is the first shift register, has an output terminal connected to said input terminal of the next shift register, or to said input terminal of the fist shift register after said logic computation together with said external initialization signal if the current shift register is the last shift register, and has said output terminal connected to said write control of a data storage unit at the same serial position, and to said read control of a data storage unit at the next serial, or to said read control of the first data storage unit if the current shift register is the last shift register;

wherein said gated driver tree has an input terminal and comprises a plurality of driver units, each of which has a plurality of input terminals and an output terminal, arranged in an hierarchical architecture having K−1 (K>1) levels, the top level (level K−1) has $M_{K-1}$ driver units, each of which has one of said input terminals connected to said input terminal of said gated driver tree simultaneously so as to receive an external W-bit data, and has said output terminal connected to one of said input terminals of one of $M_{K-2}$ driver units at the next lower level (level K−2) respectively, each of said $M_{K-2}$ driver units has said output terminal connected to one of said input terminals of one of $M_{K-3}$ driver units at the next lower level (level K−3) respectively, and so on until the bottom level (level 1) where each of $M_1$ driver units has said output terminal connected to a block of M storage units among a plurality of blocks of M storage units of said data storage array respectively, and wherein $N=M\times M_1\times M_2\times \ldots \times M_{K-1}(M, M_1, M_2, \ldots, M_{K-1}>1)$, the rest of said input terminals of every said driver unit are connected, after a logic computation, to said output terminals of a plurality of said shift registers of said ring counter respectively, said logic computation determines whether to pass said external W-bit data from the upper level to the next lower level such that, at any point in time, said external W-bit data is written into only a block of M storage units.

12. The low-power delay buffer circuit as claimed in claim 11, wherein said data storage unit comprises at least a latch.

13. The low-power delay buffer circuit as claimed in claim 11, wherein said data storage array is a dual-port memory array having N addresses and each of said addresses stores a W-bit data.

14. The low-power delay buffer circuit as claimed in claim 11, wherein said shift register is a positive-edge-triggered shift register.

15. The low-power delay buffer circuit as claimed in claim 11, wherein said shift register is a double-edge-triggered shift register.

16. The low-power delay buffer circuit as claimed in claim 11, wherein said driver unit comprises at least a tri-state inverter having an input terminal and an output terminal and a control terminal, and a control circuit having two input terminals and an output terminal, said output terminal of said tri-state inverter is connected to said output terminal of said driver unit, said input terminals of said driver unit is connected to said input terminals of said tri-state inverter and said control circuit, a driver unit at the top level of said hierarchical architecture has said input terminals of said tri-state inverter connected to said input terminal of said gated driver tree, a driver unit at a lower level has said input terminal of said tri-state inverter connected to said output terminal of a driver unit at next higher level, said control terminal of said tri-state inverter is connected to said output terminal of said control circuit, said shift registers of said ring counter are grouped into blocks of M shift registers, a block of M shift registers issues an address signal indicating an address under said driver unit in said hierarchical architecture, said control circuit has one of said input terminals connected to a start signal taken from said output terminal of the first shift register of said block of M shift registers, and said control circuit has the other input terminal connected to a stop signal taken from said output terminal of the first shift register of the next block of M shift registers following said block of M shift registers, and said output terminal of said control circuit changes states only when both said start signal and said stop signal have changed states.

17. The low-power delay buffer circuit as claimed in claim 16, wherein said control circuit comprises a C-element.

18. A low-power delay buffer circuit driven by an external clock signal providing a delay of length N−1 (N>1) clock cycles for a W (W≧1)-bit data, comprising:

a data storage array which has an input driver and a gated driver tree and comprises N data storage units arranged in sequence, each of said data storage units
  stores a W-bit data, has an input port connected to said input driver and an output port connected to said gated driver tree,
  has a read control and a write control,
  receives and stores an external W-bit data through said input driver when said write control is enabled, and
  delivers a stored W-bit data through said gated driver tree when said read control is enabled; and a ring counter which is triggered by said external clock signal and comprises N series-connected shift registers, each of said shift registers has a clock input terminal connected to said external clock signal,
  has an input terminal connected to an output terminal of the previous shift register, or to said output terminal of the last shift register after a logic computation together with an external initialization signal if the current shift register is the first shift register,
  has an output terminal connected to said input terminal of the next shift register, or to said input terminal of the fist shift register after said logic computation together with said external initialization signal if the current shift register is the last shift register, and
  has said output terminal connected to said write control of a data storage unit at the same serial position, and to said read control of a data storage unit at the next serial position, or to said read control of the first data storage unit if the current shift register is the last shift register;

wherein said gated driver tree has an output terminal and comprises a plurality of driver units, each of which has a plurality of input terminals and an output terminal, arranged in hierarchical architecture having K−1 (K>1) levels, the bottom level (level K−1) has $M_{K-1}$ driver units, each of which has said output terminal connected to said output terminal of said gated driver tree simultaneously so as to deliver a W-bit data, and has one of said input terminals connected to said output terminal of one of $M_{K-2}$ driver units at the next higher level (level K−2) respectively, each of said $M_{K-2}$ driver units has one of said input terminals connected to said output terminal of one of $M_{K-3}$ driver units at the next higher level (level K−3) respectively, and so on until the top level (level 1) where each of $M_1$ driver units has one of said input terminals connected to a block of M storage units among a plurality of blocks of M storage units of said data storage array respectively, and wherein $N=M\times M_1\times M_2\times \ldots \times M_{K-1}$ (M, $M_1, M_2, \ldots, M_{K-1}>1$), the rest of said input terminals of every said driver unit are connected, after a logic computation, to said output terminals of a plurality of said shift registers of said ring counter respectively, said logic computation determines whether to pass said W-bit data from the upper level to the next lower level such that, at any point in time, said W-bit data is read from only a block of M storage units.

19. The low-power delay buffer circuit as claimed in claim 18, wherein said data storage unit comprises at least a latch.

20. The low-power delay buffer circuit as claimed in claim 18, wherein said data storage array is a dual-port memory array having N addresses and each of said addresses stores a W-bit data.

21. The low-power delay buffer circuit as claimed in claim 18, wherein said shift register is a positive-edge-triggered shift register.

22. The low-power delay buffer circuit as claimed in claim 18, wherein said shift register is a double-edge-triggered shift register.

23. The low-power delay buffer circuit as claimed in claim 18, wherein said driver unit comprises at least a tri-state inverter having an input terminal and an output terminal and a control terminal, and a control circuit having two input terminals and an output terminal, said output terminal of said tri-state inverter is connected to said output terminal of said driver unit, said input terminals of said driver unit is connected to said input terminals of said tri-state inverter and said control circuit, a driver unit at the bottom level of said hierarchical architecture has said output terminal of said tri-state inverter connected to said out terminal of said gated driver tree, a driver unit at a higher level has said output terminal of said tri-state inverter connected to said input terminal of a driver unit at next lower level, said control terminal of said tri-state inverter is connected to said output terminal of said control circuit, said shift registers of said ring counter are grouped into blocks of M shift registers, a block of M shift registers issues an address signal indicating an address above said driver unit in said hierarchical architecture, said control circuit has one of said input terminals connected to a start signal taken from said output terminal of the first shift register of said block of M shift registers, and said control circuit has the other input terminal connected to a stop signal taken from said output terminal of the first shift register of the next block of M shift registers following said block of M shift registers, and said output terminal of said control circuit changes states only when both said start signal and said stop signal have changed states.

24. The low-power delay buffer circuit as claimed in claim 23, wherein said control circuit comprises a C-element.

* * * * *